(12) United States Patent
Liu

(10) Patent No.: US 12,426,169 B2
(45) Date of Patent: Sep. 23, 2025

(54) DISPLAY MODULE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventor: Zongwei Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 548 days.

(21) Appl. No.: 17/795,545

(22) PCT Filed: Jun. 9, 2022

(86) PCT No.: PCT/CN2022/097904
§ 371 (c)(1),
(2) Date: Jul. 27, 2022

(87) PCT Pub. No.: WO2023/226092
PCT Pub. Date: Nov. 30, 2023

(65) Prior Publication Data
US 2023/0403801 A1    Dec. 14, 2023

(30) Foreign Application Priority Data
May 25, 2022   (CN) .......................... 202210587444.4

(51) Int. Cl.
*B32B 3/10*    (2006.01)
*B32B 3/02*    (2006.01)
(Continued)

(52) U.S. Cl.
CPC ............. *H05K 5/0018* (2022.08); *B32B 3/02* (2013.01); *B32B 3/10* (2013.01); *B32B 3/22* (2013.01); *H05K 3/361* (2013.01)

(58) Field of Classification Search
CPC ................... H05K 1/189; H05K 3/361; H05K 2201/09918
See application file for complete search history.

(56) References Cited

U.S. PATENT DOCUMENTS

2012/0319980 A1*  12/2012  Nagaoka ............... H05K 1/0269
                                                              174/250
2022/0071011 A1*  3/2022  Ryu ..................... G06F 3/04164
2022/0085076 A1   3/2022  Wang et al.

FOREIGN PATENT DOCUMENTS

CN      107658234 A     2/2018
CN      109541834 A     3/2019
(Continued)

OTHER PUBLICATIONS

International Search Report in International application No. PCT/CN2022/097904, mailed on Dec. 21, 2022.
(Continued)

*Primary Examiner* — Elizabeth E Mulvaney
(74) *Attorney, Agent, or Firm* — Rivka Friedman

(57) ABSTRACT

Disclosed are a display module and a mobile terminal. The display module includes a first bonding segment of a display panel and a second bonding segment on a flexible circuit board, wherein a second bonding terminal on the second bonding segment corresponds to and is electrically connected to a first bonding terminal on the first bonding segment, and a second mark is disposed opposite to a first mark; a support layer is disposed between the first bonding segment and the second bonding segment, and a projection of the support layer in a direction perpendicular to the first
(Continued)

bonding segment is disposed on a peripheral side of the first mark.

20 Claims, 7 Drawing Sheets

(51) Int. Cl.
*B32B 3/22* (2006.01)
*H05K 3/36* (2006.01)
*H05K 5/00* (2006.01)

(56) References Cited

FOREIGN PATENT DOCUMENTS

| | | |
|---|---|---|
| CN | 110085649 A | 8/2019 |
| CN | 110609421 A | 12/2019 |
| CN | 112086495 A | 12/2020 |
| CN | 112599016 A | 4/2021 |
| CN | 113421909 A | 9/2021 |
| CN | 214541377 U | 10/2021 |
| CN | 113707700 A | 11/2021 |
| CN | 114220840 A | 3/2022 |
| CN | 114373390 A | 4/2022 |
| CN | 114389064 A | 4/2022 |
| WO | 2021164360 A1 | 8/2021 |

OTHER PUBLICATIONS

Written Opinion of the International Search Authority in International application No. PCT/CN2022/097904, mailed on Dec. 21, 2022.
Chinese Office Action issued in corresponding Chinese Patent Application No. 202210587444.4 dated Dec. 15, 2022, pp. 1-10.

\* cited by examiner

DISPLAY MODULE AND MOBILE TERMINAL

TECHNICAL FIELD

The present disclosure relates to the field of display, and in particular, to a display module and a mobile terminal.

BACKGROUND OF THE INVENTION

At present, the connection between a drive chip of a flexible display screen and a display panel adopts flexible bonding technology, which requires the use of high temperature and high pressure conditions in a flexible printed circuit board bonding process for flexible screens.

Under the condition of high temperature and high pressure, a mark of the flexible printed circuit board and a mark of the display panel are first aligned during bonding, and then a bonding segment of the flexible printed circuit board and a bonding segment of the display panel are pressed together under pressure. In the bonding and pressing of bonding segments around the marks of the flexible printed circuit board and the display panel, because the marks have a small area, and a step difference between two pressed surfaces around the marks is large, and a distance between one mark and an adjacent bonding terminal is far, and no support structure is present around the marks, the force on the display panel near the mark is not uniform during pressing, and a corresponding position of the display panel is prone to crack, thereby affecting product reliability.

Technical Problems

Embodiments of the present disclosure provide a display module and a mobile terminal, so as to solve the technical problems that, in the bonding and pressing of bonding segments around the marks of the flexible printed circuit board and the display panel, because the marks have a small area, and a step difference between two pressed surfaces around the marks is large, and a distance between one mark and an adjacent bonding terminal is far, and no support structure is present around the marks, the force on the display panel near the mark is not uniform during pressing, and a corresponding position of the display panel is prone to crack, thereby affecting product reliability.

Technical Solutions

To solve the above problems, the present disclosure provides the following technical solutions.

Embodiments of the present disclosure provide a display module comprising:

- a display panel comprising a display segment and a first bonding segment, wherein the first bonding segment is provided with a first mark and a first bonding terminal; and
- a flexible circuit board comprising a second bonding segment disposed opposite to the first bonding segment, wherein the second bonding segment is provided with a second mark and a second bonding terminal, the second bonding terminal corresponds to and is electrically connected to the first bonding terminal, and the second mark is disposed opposite to the first mark;
- wherein a support layer is disposed between the first bonding segment and the second bonding segment, and a projection of the support layer in a direction perpendicular to the first bonding segment is disposed at least on a peripheral side of the first mark and/or the second mark.

In one embodiment, a thickness of the support layer in the direction perpendicular to the first bonding segment is less than a perpendicular distance between the first bonding segment and the second bonding segment, and the support layer is spaced apart from the first bonding segment or the second bonding segment.

In one embodiment, the support layer comprises a first support layer disposed on the first bonding segment and/or a second support layer disposed on the second bonding segment.

In one embodiment, the support layer comprises the first support layer and the second support layer, and a height of the second support layer in a direction perpendicular to the second bonding segment is less than a height of the second bonding terminal.

In one embodiment, the support layer comprises a third support layer disposed on the first bonding segment, and a projection of the third support layer in the direction perpendicular to the first bonding segment is disposed on a peripheral side of the first bonding terminal.

In one embodiment, the support layer comprises a fourth support layer disposed on the second bonding segment, and a projection of the fourth support layer in the direction perpendicular to the first bonding segment is disposed on a peripheral side of the second bonding terminal.

In one embodiment, the support layer comprises an organic film layer disposed on the first bonding segment, and the organic film layer is disposed surround the first mark in the direction perpendicular to the first bonding segment, and/or the organic film layer is disposed on the second bonding segment, and the organic film layer is disposed surround the second mark in a direction perpendicular to the second bonding segment.

In one embodiment, the support layer comprises at least one support structure group, the number of the at least one support structure group is the same as the number of the first mark; one of the at least one support structure group comprises a plurality of spaced support structures, and the plurality of support structures are disposed on a peripheral side of a corresponding first mark and/or second mark.

In one embodiment, a spacing between every two adjacent support structures is gradually increased along a direction away from the first mark and/or the second mark, within one of the at least one support structure group.

In one embodiment, a projection area of the support structures on the first bonding segment is gradually reduced in a direction away from the first mark and/or the second mark, within one of the at least one support structure group.

In one embodiment, each of the support structures comprises a first surface facing the first bonding segment and a second surface facing the second bonding segment, and an area of the first surface is greater than an area of the second surface in the direction perpendicular to the first bonding segment.

The present disclosure further provides a mobile terminal, comprising a display module and a terminal body, wherein the terminal body is integrated with the display module, and the display module comprises:

- a display panel comprising a display segment and a first bonding segment, wherein the first bonding segment is provided with a first mark and a first bonding terminal; and a flexible circuit board comprising a second bonding segment disposed opposite to the first bonding segment, wherein the second bonding segment is provided with a second mark and a second bonding terminal, the second bonding terminal corresponds to and is electrically connected to the first bonding terminal, the second mark is disposed opposite to the first mark;

wherein a support layer is disposed between the first bonding segment and the second bonding segment, and a projection of the support layer in a direction perpendicular to the first bonding segment is disposed at least on a peripheral side of the first mark and/or the second mark.

In one embodiment, a thickness of the support layer in the direction perpendicular to the first bonding segment is less than a perpendicular distance between the first bonding segment and the second bonding segment, and the support layer is spaced apart from the first bonding segment or the second bonding segment.

In one embodiment, the support layer comprises a first support layer disposed on the first bonding segment and/or a second support layer disposed on the second bonding segment.

In one embodiment, the support layer comprises the first support layer and the second support layer, and a height of the second support layer is less than a height of the second bonding terminal in a direction perpendicular to the second bonding segment.

In one embodiment, the support layer comprises a third support layer disposed on the first bonding segment, and a projection of the third support layer in the direction perpendicular to the first bonding segment is disposed on a peripheral side of the first bonding terminal.

In one embodiment, the support layer comprises a fourth support layer disposed on the second bonding segment, and a projection of the fourth support layer in the direction perpendicular to the first bonding segment is disposed on a peripheral side of the second bonding terminal.

In one embodiment, the support layer comprises an organic film layer disposed on the first bonding segment, and the organic film layer is disposed surround the first mark in the direction perpendicular to the first bonding segment, and/or the organic film layer is disposed on the second bonding segment, and the organic film layer is disposed surround the second mark in a direction perpendicular to the second bonding segment.

In one embodiment, the support layer comprises at least one support structure group, the number of the at least one support structure group is the same as the number of the first mark; one of the at least one support structure group comprises a plurality of spaced support structures, and the plurality of support structures are disposed on a peripheral side of a corresponding first mark and/or second mark.

In one embodiment, a spacing between every two adjacent support structures is gradually increased along a direction away from the first mark and/or the second mark, within one of the at least one support structure group.

BENEFICIAL EFFECTS

The display module provided in the present disclosure includes a display panel and a flexible circuit board facing the display panel. A first bonding segment of the display panel includes a first mark and a first bonding terminal, and a second bonding segment of the flexible circuit board includes a second mark and a second bonding terminal. The first mark and the second mark are disposed opposite to each other in a direction perpendicular to the display panel, and the first bonding terminal is disposed opposite to the second bonding terminal. A support layer is disposed between the first bonding segment and the second bonding segment, and the support layer is disposed at least at a peripheral side of the first mark and/or the second mark. By this configuration, the step difference between the first bonding segment and the second bonding segment at the peripheral side of the marks is effectively reduced, thereby solving the problem that the force applied to the display panel is not uniform and cracks are easily generated in a high temperature and high pressure environment due to the small mark area and the large step difference between two pressed surfaces around the marks during the pressing and bonding process of the display module, effectively reducing the probability that cracks are generated in the display panel around the marks when the display module is pressed, and improving the reliability of the product.

EMBODIMENTS OF THE INVENTION

Figure 1:
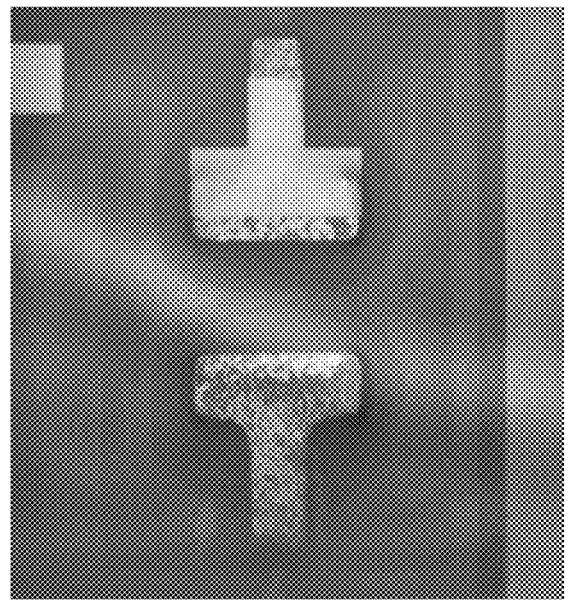
FIG. 1 is a schematic view of cracks of a panel around markers after a display module is pressed and bonded in a prior art.

The present disclosure provides a display module and a mobile terminal. In order to make the objective, technical solutions and effects of the present disclosure clearer and explicit, the present disclosure is described further in detail below with reference to the accompanying drawings and examples. It should be understood that the specific embodiments described herein are merely intended to explain the present disclosure and are not intended to limit the present disclosure.

Embodiments of the present disclosure provide a display module and a mobile terminal, each of which will be described in detail below. It is to be noted that the order of description of the following embodiments is not a definition of the preferred order of the embodiments.

Embodiments of the present disclosure provides a display module, as shown in FIGS. 2-15, including:
- a display panel 10, wherein the display panel 10 comprises a display segment AA, and a first bonding segment B1 provided with a first mark 102 and a first bonding terminal 103;
- a flexible circuit board 20, wherein the flexible circuit board 20 comprises a second bonding segment B2 disposed opposite to the first bonding segment B1, and the second bonding segment B2 is provided with a second mark 202 and a second bonding terminal 203. The second bonding terminal 203 corresponds to and is electrically connected to the first bonding terminal 103, and the second mark 202 is disposed opposite to the first mark 102;
- wherein a support layer 30 is disposed between the first bonding segment B1 and the second bonding segment B2, and a projection of the support layer 30 in a direction perpendicular to the first bonding segment B1 is disposed at least on a peripheral side of the first mark 102 and/or the second mark 202.

Specifically, the display panel 10 may be a light-emitting diode (LED) display panel 10, an organic electroluminescence display (OLED) panel 10, or a liquid crystal display (LCD) panel, and may be selected according to actual production conditions.

Specifically, the display panel 10 comprises the display segment AA, a bending segment and the first bonding segment B1, and the bending segment connects the display segment AA and the first bonding segment B1, so that the first bonding segment B1 is located on a backlight surface of the display segment AA. The display panel 10 further comprises an array substrate. The array substrate is provided with a plurality of sub-control devices (the sub-control devices may be thin film transistors) at a position corresponding to the display segment AA. The sub-control devices are used to control the light emission of a light-emitting layer (specifically, a light-emitting unit) of the display panel 10. A wire in each of sub-control devices is extended and converged to the first bonding segment B1, and is connected to a corresponding first bonding terminal 103 according to the type of the wire. There may be a plurality of first bonding terminals 103, and the specific number thereof is adjusted according to actual production conditions. The first bonding terminal 103 is connected to a drive chip of the flexible circuit board 20.

Figure 2:
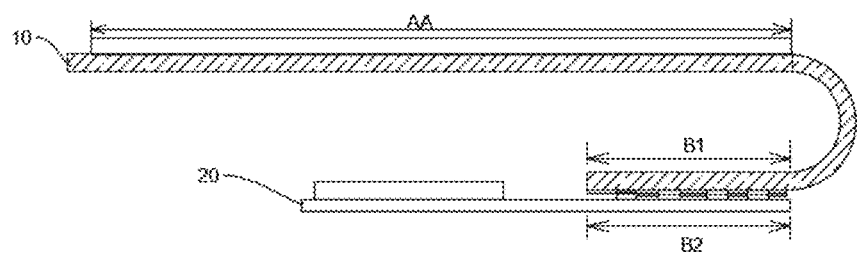
FIG. 2 is a view of a pressed structure of a display module according to an embodiment of the present disclosure.

Specifically, as shown in FIG. 2, the flexible circuit board 20 includes a drive chip, and the drive chip is connected to a metal wire. The metal wire is extended and converged to the second bonding segment B2, and connected to the second bonding terminal 203 on the second bonding segment B2. There may be a plurality of second bonding terminals 203, and the specific number thereof is adjusted according to actual production conditions. The number of second bonding terminals 203 is generally the same as the number of first bonding terminals 103. By aligning the second bonding segment B2 of the flexible circuit board 20 and the first bonding segment B1 of the display panel 10, the first bonding terminal 103 and the second bonding terminal 203 are pressed together, so as to achieve an electrical connection therebetween and complete the assembly of the display module. A pressed display module as an example will be illustrated in embodiments of the present disclosure.

Specifically, the first bonding segment B1 includes a first substrate 101, and the second bonding segment B2 includes a second substrate 201. Both of the first bonding terminal 103 and the first mark 102 are disposed on the first substrate 101, and both of the second bonding terminal 203 and the second mark 202 are disposed on the second substrate 201.

It is to be noted that, in order to achieve accurate alignment, the first bonding segment B1 of the display panel 10 and the second bonding segment B2 of the flexible circuit board 20 are provided with a mark. In the present disclosure, the first mark 102 is disposed on the first bonding segment B1, and the second mark 202 is disposed on the second bonding segment B2. The first mark 102 is matched with the second mark 202 (including in both the number and shape). It is to be further understood that, after alignment, pressing together and electrical connection, the first mark 102 is overlapped with a projection of the second mark 202 on the first bonding segment B1.

Specifically, the shapes of the first mark 102 and the second mark 202 are not limited, and they may be T-shaped or cross-shaped. The T-shaped marks as an example are illustrated in present disclosure.

At present, in the prior art, in the pressing and bonding process of the display module, the marks of the display panel 10 and the flexible circuit board 20 are first aligned, and then the display panel 10 and the flexible circuit board 20 are pressed together under a condition of high temperature and high pressure. In the pressing process, since the marks have a small area, and a step difference between the mark and the pressed surface (corresponding to a surface of the array substrate of the display panel 10 or a surface of the flexible circuit board 20 opposite to the surface of the array substrate of the display panel 10) is large, the force applied to the display panel 10 is uneven during the pressing, and cracks are easily generated on the display panel 10 (exactly on the first bonding segment B1) particularly close to the mark. As shown in FIG. 1, black stripes (cracks) are formed around the T-shaped marks. The cracks are generally formed on the pressed surfaces close to the marks (i.e., close to a location forming the step difference), thereby affecting product reliability.

In order to solve the above problems, in this embodiment, a support layer 30 is disposed between the first bonding segment B1 and the second bonding segment B2. In a direction perpendicular to the first bonding segment B1, a projection of the support layer 30 is arranged at least on a peripheral side of the first mark 102 and/or the second mark 202, so that a step difference between one mark and a pressed surface around the one mark is reduced, and the pressing force applied to the display panel 10 corresponding to the pressed surface around the mark during the pressing is alleviated, thereby reducing the probability of crack generation. The exact degree of alleviation can be found in a simulation model test of experimental examples described later.

Figure 3:
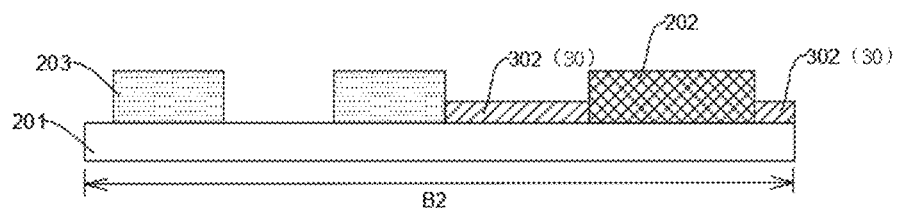
FIG. 3 is a schematic structural view of a part of a flexible circuit board of a display module according to an embodiment of the present disclosure.
Figure 4:
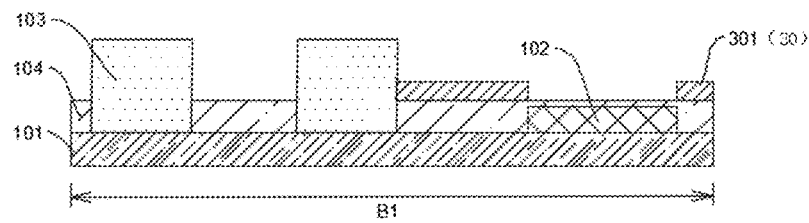
FIG. 4 is a schematic structural view of a part of a display panel of a display module according to an embodiment of the present disclosure.

Specifically, the support layer 30 may be disposed on the first bonding segment B1 (as shown in FIG. 4), or may be disposed on the second bonding segment B2 (as shown in FIG. 3), or may be disposed on both the first bonding segment B1 and the second bonding segment B2. For example, the support layer 30 may include a first support layer 301 disposed on the first bonding segment B1 and/or a second support layer 302 disposed on the second bonding segment B2. Those setting manners that can reduce the step difference between two pressed surfaces around the marks are all within the scope of the present disclosure.

Figure 6:
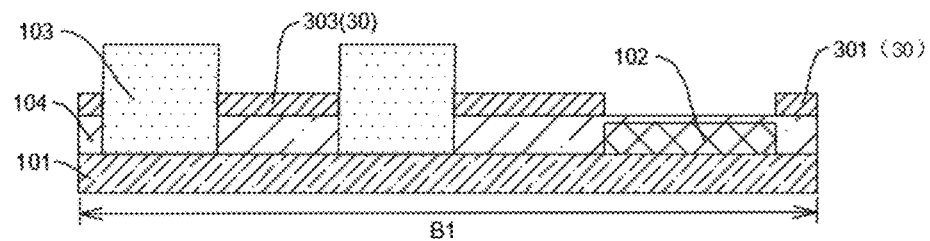
FIG. 6 is a schematic structural view of a part of a display panel of a display module according to an embodiment of the present disclosure.

It is to be noted that, as shown in FIGS. 4 and 6, due to the own encapsulation structure of the display panel 10, an inorganic protective layer 104 is disposed on the display panel 10. The first mark 102 is generally located under the inorganic protective layer 104, and the first support layer 301 is generally disposed on the inorganic protective layer 104.

Figure 15A:
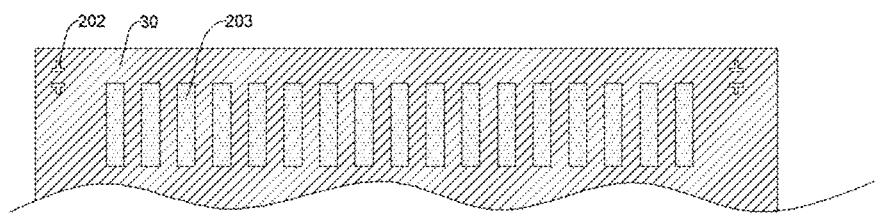
FIG. 15a is a top view of a second bonding part of a flexible circuit board of a display module according to an embodiment of the present disclosure.
Figure 15B:
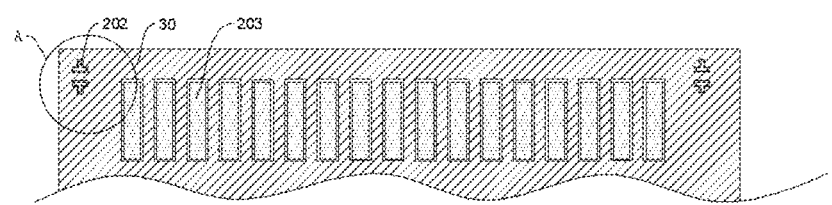
FIG. 15b is a top view of a second bonding part of a flexible circuit board of another display module according to an embodiment of the present disclosure.
Figure 15C:
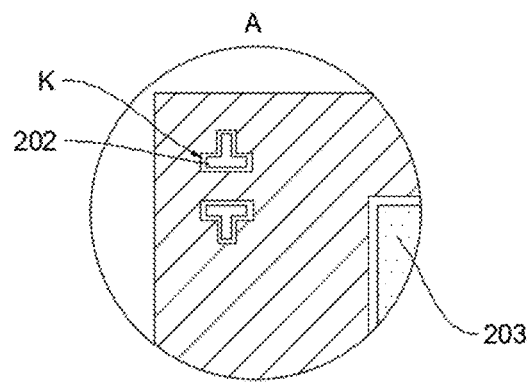
FIG. 15c is an enlarged view at A in FIG. 15b of the present disclosure.

Specifically, as shown in FIGS. 15a, 15b, and 15c, the second support layer 302 on the second bonding segment B2 may be in contact with the second mark 202, or may be disposed around the second mark 202, or may be spaced a certain distance from the second mark 202.

Figure 8:
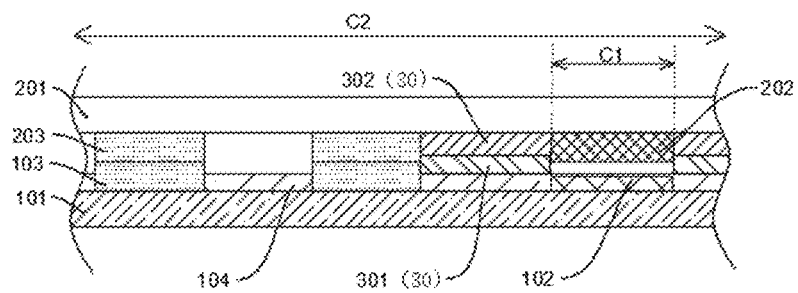
FIG. 8 is a schematic structural view of a part of another display module according to an embodiment of the present disclosure.

Specifically, a projection of the support layer 30 in the direction perpendicular to the first bonding segment B1 is arranged at least on the peripheral side of the first mark 102 and/or the second mark 202. It can be understood that, as shown in FIG. 8, the display module comprises a bonding region C2, and the first bonding segment B1 and the second bonding segment B2 are bonded in the bonding region C2. The bonding region C2 comprises a marking region C1, and the first mark 102 and the second mark 202 are aligned in the marking region C1. The support layer 30 is disposed in the bonding region C2 and is located outside the marking region C1. The support layer 30 is disposed close to the marking region C1, and the support layer 30 may half surround the first mark 102 and/or the second mark 202, or may fully surround the first mark 102 and/or the second mark 202.

It is to be noted that, the cracks generated by pressing are mainly due to the lack of interlayer (the first bonding segment B1 and the second bonding segment B2) support. When one mark and another mark, one mark and one bonding terminal, and one bonding terminal and another bonding terminal are closely spaced from each other, they can support each other, so that the pressing force of the pressed surfaces is easily dispersed during the pressing and thus there is less risk of cracking. When there is no support on a peripheral side of the mark(s) or bonding terminal(s), and a step difference between the layers is large, the pressing force generated by the pressing is concentrated close to a position where the step difference is formed, resulting in cracks easily generated at the first bonding segment B1 around the mark(s) (around the step difference).

Figure 12:
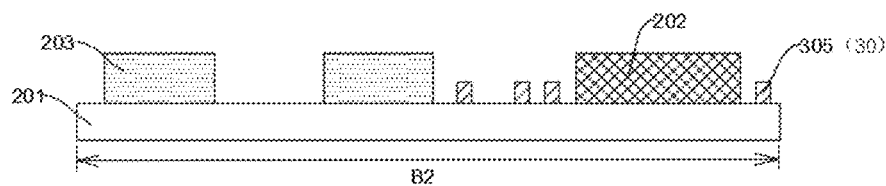
FIG. 12 is a schematic structural view of a part of a flexible circuit board of a display module according to an embodiment of the present disclosure.

Specifically, a peripheral side of the second mark 202 is taken as an example for explanation. When the second mark 202 is half surrounded by the support layer 30 in a direction perpendicular to the second bonding segment B2, it is preferable that the support layer 30 is disposed on a side of one second mark 202 away from adjacent another second mark 202 or second bonding terminal 203, for example, on the right side of the second mark 202 as shown in FIG. 12.

Specifically, the generation of the step difference is caused by the structure of marks. The second mark 202 is usually small in area and has a certain thickness, and the pressed surface around the mark (that is, the position forming the step difference) is subjected to a large force during the pressing and bonding, and thus the cracks generated generally surround the mark, as shown in FIG. 1. Therefore, in order to further alleviate the generation of indentation, the corresponding support layer 30 is also required to surround the mark (first mark 102/second mark 202).

Specifically, a thickness of the first support layer 301 is 3-5 μm, and a thickness of the second support layer 302 is 3-10 μm.

Specifically, the support layer 30 is disposed on the first bonding segment B1 and/or the second bonding segment B2 either by lamination, or by additional film deposition around the mark when a corresponding board body is manufactured (specifically, the manufacturing of the display panel 10 or the manufacturing of the flexible circuit board 20).

Specifically, the support layer 30 may be a film layer structure arranged on the whole surface, and the thickness of each part of the film layer structure may be equal or different. The film layer structure is not limited to a single film layer or a multilayer film stack. The support layer 30 may also be a patterned support layer structure, which may be adjusted according to actual production needs.

Specifically, a material for forming the support layer 30 may be an organic material, including but not limited to PI (polyimide), UV glue, and PET (polyethylene glycol terephthalate).

Specifically, the color of the support layer 30 needs to be distinguished from that of the first mark 102 and the second mark 202. The specific color is not limited, and all of colors that do not affect the alignment of the first mark 102 and the second mark 202 are within the scope of the present disclosure. The support layer 30 is preferably a transparent material.

It can be understood that, the display module provided in the present disclosure comprises a display panel 10, and a flexible circuit board 20 facing the display panel 10. A first bonding segment B1 of the display panel 10 comprises a first mark 102 and a first bonding terminal 103, and a second bonding segment B2 of the flexible circuit board 20 comprises a second mark 202 and a second bonding terminal 203. The first mark 102 and the second mark 202 are disposed opposite to each other in a direction perpendicular to the display panel 10. The first bonding terminal 103 is disposed opposite to the second bonding terminal 203. A support layer 30 is disposed between the first bonding segment B1 and the second bonding segment B2, and the support layer 30 is disposed at least at a peripheral side of the first mark 102 and/or the second mark 202, thereby effectively reducing a step difference of a peripheral side of marks between the first bonding segment B1 and the second bonding segment B2, addressing the problem that the display panel 10 is subjected to uneven force and is prone to cracking under high temperature and high pressure environments due to a small area of the markers and a large step difference between the pressed surfaces around the markers during the pressing and bonding of the display module, and effectively reducing the probability of cracks occurring in the display panel 10 around the markers when the display module is pressed, thereby improving the reliability of products.

In an embodiment, the thickness of the support layer 30 in the direction perpendicular to the first bonding segment B1 is less than a perpendicular distance between the first bonding segment B1 and the second bonding segment B2. The support layer 30 is spaced apart from the first bonding segment B1 or the second bonding segment B2.

It is to be noted that in the absence of the support layer 30, the first bonding terminal 103 is electrically connected to the second bonding terminal 203. A perpendicular distance between the first bonding section B1 and the second bonding section B2 is L, and L is within a range of $L1 \leq L \leq L2$, within which the first bonding terminal 103 and the second bonding terminal 203 can be electrically connected to each other. When L is L1, the first bonding terminal 103 and the second bonding terminal 203 has been pressed together tightly, and the perpendicular distance between the first bonding terminal 103 and the second bonding terminal 203 cannot be further reduced; and when L is greater than L2, the first bonding terminal 103 is disconnected from the second bonding terminal 203.

Specifically, in this embodiment, the thickness of the support layer 30 is less than the perpendicular distance between the first bonding segment B1 and the second bonding segment B2, meaning that the thickness of the support layer 30 is less than L1.

Specifically, since the first bonding terminal 103 of the present disclosure is electrically connected to the second bonding terminal 203, the thickness of the support layer 30 is by default less than or equal to L2.

Specifically, the thickness of the support layer 30 is generally not specifically limited, as long as it does not affect the electrical connection of the first bonding terminal 103 and the second bonding terminal 203.

Specifically, in order to further improve the user experience of the display module and reduce the thickness of the display module, the thickness of the support layer 30 is set to be less than the perpendicular distance between the first bonding segment B1 and the second bonding segment B2.

It is to be noted that, since the height of the first mark 102 is less than the height of the first bonding terminal 103 (the first mark 102 is located under the inorganic protective layer 104), and the height of the second mark 202 is less than the height of the second bonding terminal 203, there is a gap between the first bonding segment B1 and the second bonding segment B2 around the marks after the display panel 10 and the flexible circuit board 20 are aligned to each other. The gap of the display module after being pressed is the pressed step difference.

Specifically, the support layer 30 may be an organic film layer, and may be a single-layer or a stacked multilayer organic film structure. In this embodiment, each part of the support layer 30 is of equal thickness.

It can be understood that, by setting the thickness of the support layer 30 to be less than the perpendicular distance between the first bonding terminal 103 and the second bonding terminal 203, a gap between the first bonding terminal 103 and the second bonding terminal 203 is filled, while not affecting the pressing and bonding of the first bonding terminal 103 and the second bonding terminal 203 on the display panel 10 and the flexible circuit board 20, thereby alleviating the pressing force on the pressed surfaces around the first mark 102 and/or the second mark 202 during pressing the display panel 10 and the flexible circuit board 20, and in turn reducing the probability of cracks occurring close to the marks of the display panel 10, improving the reliability of the product, ensuring a lower thickness of the display module, and improving the user experience of the product, after the display module is provided with the support layer 30.

In an embodiment, the support layer 30 comprises a first support layer 301 disposed on the first bonding segment B1, and/or a second support layer 302 disposed on the second bonding segment B2.

Figure 7:
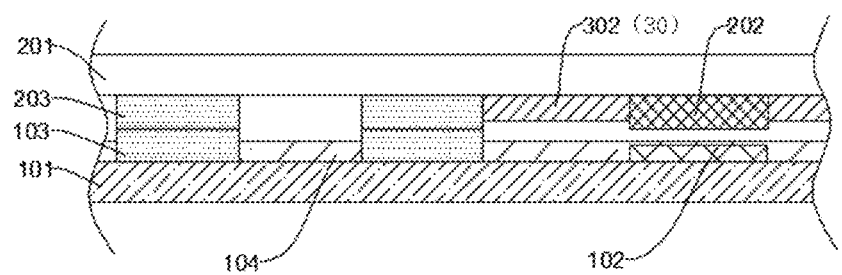
FIG. 7 is a schematic structural view of a part of a display module according to an embodiment of the present disclosure.

Specifically, FIG. 7 shows a schematic structural view of pressing and bonding of the first bonding terminal 103 and the second bonding terminal 203 of a display module, in the case where only the second support layer 302 is provided.

In an embodiment, the height of the second support layer 302 in the direction perpendicular to the second bonding segment B2 is less than the height of the second bonding terminal 203.

It is to be noted that, the height of the second mark 202 on the flexible circuit board 20 generally may not exceed the height of the second bonding terminal 203. Otherwise, the bonding and pressing of the first bonding terminal 103 and the second bonding terminal 203 may be affected, resulting in an open circuit or short circuit in the connection between the display panel 10 and the flexible circuit board 20, affecting the normal driving display of the display panel 10.

Specifically, when the support layer 30 is disposed on both the first bonding segment B1 and the second bonding segment B2, the height of the second support layer 302 disposed on the second bonding segment B2 needs to be less than the height of the second bonding terminal, so as to prevent the second support layer 302 from affecting the alignment of the first bonding terminal 103 and the second bonding terminal 203.

Specifically, the thickness of the first support layer 301 on the first bonding segment B1 is not limited, and may be less than the height of the first bonding terminal 103, or may be equal to or larger than the height of the first bonding terminal 103.

Specifically, the thickness of the first support layer 301 is 3-5 μm, and the thickness of the second support layer 302 is 3-10 μm.

Specifically, FIG. 8 shows a schematic structural view of pressing and bonding of the first bonding terminal 103 and the second bonding terminal 203 of the display module, after the first support layer 301 and the second support layer 302 are disposed on the display module.

It can be understood that, by providing the first support layer 301 on the first bonding segment B1 and the second support layer 302 on the second bonding segment B2, and setting the height of the second support layer 302 to be less than the height of the second bonding terminal, it is possible to ensure that the pressing force on the pressed surfaces around the first mark 102 and the second mark 202 can be alleviated when the display panel 10 and the flexible circuit board 20 are pressed together, and the probability of cracks occurring close to the marks of the display panel 10 is reduced, thereby improving the reliability of the product, and not affecting the alignment of the first bonding terminal 103 and the second bonding terminal 203.

In an embodiment, as shown in FIG. 6, the support layer 30 comprises a third support layer 303 disposed on the first bonding segment B1, and a projection of the third support layer 303 in the direction perpendicular to the first bonding segment B1 is disposed on the peripheral side of the first bonding terminal 103.

It is to be noted that, in addition to the first bonding segment B1 around the first marker 102, the first bonding segment B1 around the first bonding terminal 103, in particular, the first bonding segment B1 around the first bonding terminal 103 that is spaced at a greater distance from a support (where the support includes a structure capable of reducing a step difference between the first bonding segment B1 around the first bonding terminal 103 and the second bonding segment B2, for example, an adjacent first bonding terminal 103), is more prone to generate cracks, which occur for a similar reason as the first bonding segment B1 around the markers.

Figure 9:
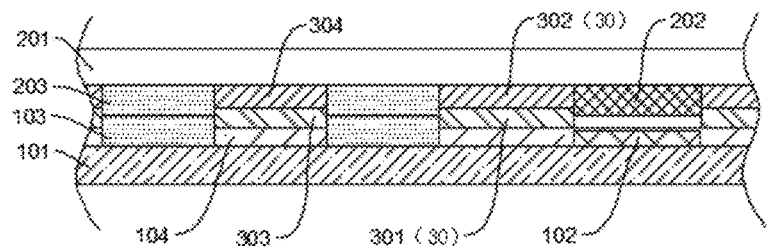
FIG. 9 is a schematic structural view of a part of another display module according to an embodiment of the present disclosure.

In order to further solve the above-described technical problems, as shown in FIGS. 6 and 9, a third support layer 303 may be disposed on a peripheral side of the first bonding terminal 103.

Specifically, the structure and material of the third support layer 303 may be the same as that of the first support layer 301, and the third support layer 303 may be manufactured in the same process as that of the first support layer 301, with which the production efficiency can be improved.

Specifically, in the third support layer 303 provided on the peripheral side of the first bonding terminal 103, the third support layer 303 may half surround the first bonding terminal 103 or may fully surround the first bonding terminal 103.

It can be understood that by providing the third support layer 303, the step difference between the first bonding segment B1 around the first bonding terminal 103 and the second bonding segment B2 is reduced, thereby reducing the risk of cracks occurring in the first bonding segment B1 around the first bonding terminal 103, which is spaced further apart (with no surrounding support structure), and improving product reliability.

Figure 5:
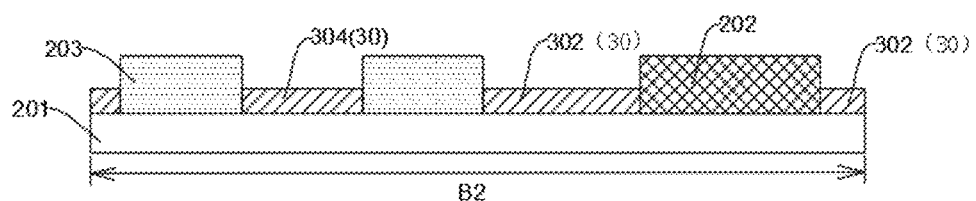
FIG. 5 is a schematic structural view of a part of a flexible circuit board of a display module according to an embodiment of the present disclosure.

In an embodiment, as shown in FIGS. 5 and 9, the support layer 30 comprises a fourth support layer 304 disposed on the second bonding segment B2, and a projection of the fourth support layer 304 in the direction perpendicular to the first bonding segment B1 is disposed on a peripheral side of the second bonding terminal 203.

Specifically, the structure and material of the fourth support layer 304 may be the same as that of the second support layer 302, and the fourth support layer 304 may be manufactured in the same process as that of the second support layer 302.

Specifically, the fourth support layer 304 is disposed on a peripheral side of the second bonding terminal 203, that is, the fourth support layer 304 may half surround the second bonding terminal 203, or may fully surround the second bonding terminal 203.

It is to be noted that, as shown in FIGS. 8 and 9, the first mark 102 and the second mark 202 are disposed opposite to each other. In FIG. 9, similarly, the fourth support layer 304 is disposed to fill a step difference between the first bonding segment B1 and the second bonding segment B2 around the bonding terminals (the first bonding terminal 103 and the second bonding terminal 203).

It can be understood that by providing the fourth support layer 304, the step difference between the first bonding segment B1 and the second bonding segment B2 around the first bonding terminal 103 is reduced, thereby reducing the risk of cracks occurring in the first bonding segment B1 around the more distantly spaced first bonding terminal 103, and improving the reliability of the product.

In an embodiment, as shown in FIGS. 15a and 15b, the support layer 30 comprises an organic film layer disposed on the first bonding segment B1, and the organic film layer surrounds the first mark 102 in the direction perpendicular to the first bonding segment B1, and/or
    the organic film layer is disposed on the second bonding segment B2, and in the direction perpendicular to the second bonding segment B2, the organic film layer surrounds the second mark 202.

Specifically, the organic film layer may be a single film layer, or may be a multilayer film stack, and the material for forming the organic film layer includes, but is not limited to, PI, UV glue, and PET.

Specifically, taking the organic film layer disposed on the second bonding segment B2 as an example will be described. A projection of the organic film layer on the second bonding segment B2 has an opening K, and a projection of the first mark 102 on the second bonding segment B2 is located in the opening K (FIGS. 15b and 15c) or coincides with the opening K (FIG. 15a).

It can be understood that by setting the support layer 30 to comprise an organic film layer disposed on the entire surface of the first bonding segment B1/the second bonding segment B2, the step difference between the first bonding segment B1 and the second bonding segment B2 around the first mark 102 or the second mark 202 can be reduced as much as possible, thereby reducing the risk of cracks occurring in the first bonding segment B1 during the pressing.

In an embodiment, the support layer 30 comprises at least one support structure group, and the number of the support structure groups is the same as the number of the first marks 102. One of the support structure groups comprises a plurality of spaced support structures 305. In one of the support structure groups, the plurality of support structures 305 are disposed on a peripheral side of the corresponding first mark 102 and/or the second mark 202.

It is to be noted that, the support layer 30 mainly serves to support the first bonding segment B1 and the second bonding segment B2, and to reduce the step difference between the first bonding segment B1 and the second bonding segment B2. The organic film layer disposed on an entire surface occupies the space between the first bonding segment B1 and the second bonding segment B2 to a great extent, so that the space utilization of the display module is low. After the organic film layer is disposed on the entire surface, when there is a problem in the wiring of the first bonding segment B1/second bonding segment B2 of the display panel 10, the subsequent maintenance is complicated. In order to solve the above technical problems, the present embodiment provides the following technical solutions.

Specifically, the support layer 30 is disposed to comprise at least one of the support structure groups, the number of the support structure groups is the same as the number of the first marks 102, and a plurality of support structures 305 of the support structure groups are disposed on a peripheral side of the marks (the first mark 102 and/or the second mark 202).

Specifically, the shape of each of the support structures 305 is not limited, and may be any one of a cylinder, a prism, a circular platform, or a truncated pyramid, or may be a support bar arranged regularly or irregularly. All of structures that can provide a support effect are within the scope of the present disclosure. The embodiment of the present disclosure is illustrated by the example of the support structure 305 as a cylinder.

Figure 10:
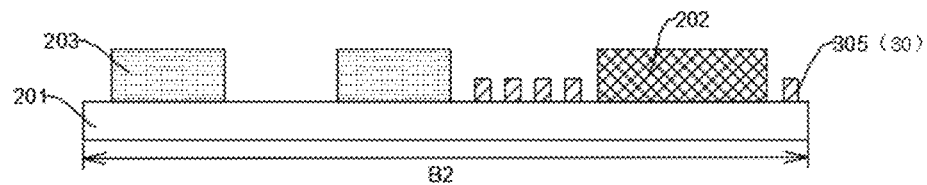
FIG. 10 is a schematic structural view of a part of a flexible circuit board of a display module according to an embodiment of the present disclosure.
Figure 11:
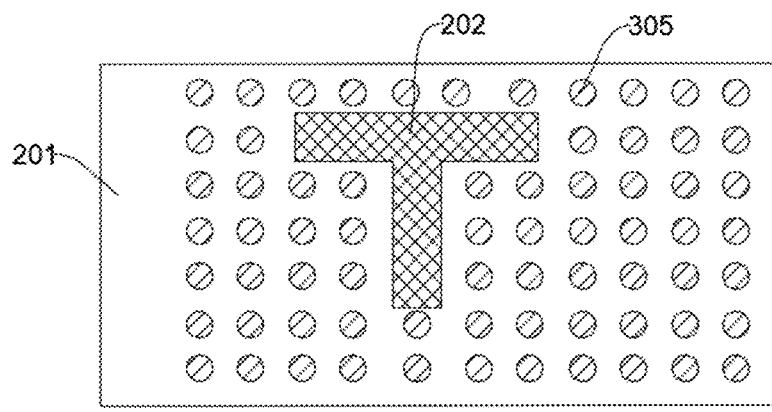
FIG. 11 is a top view showing a position of a second mark of a flexible circuit board of a display module according to an embodiment of the present disclosure.

Specifically, the arrangement of the plurality of support structures 305 is not limited, and may be a lattice arrangement as shown in FIGS. 10 and 11, but is not limited thereto. The distance between two adjacent support structures 305 may be not limited.

Specifically, the material for forming the support structures 305 include, but is not limited to, an organic material. The support structures 305 may be prepared by first forming an organic film layer and then patterning the organic film layer.

It can be understood that, the support layer 30 is set to comprise at least one support structure group, the number of the at least one support structure group is the same as the number of the first marks 102, one of the support structure groups comprises a plurality of spaced support structures 305, and the plurality of support structures 305 is disposed on a peripheral side of the marks (the first mark 102 and/or the second mark 202) in one of the support structure groups. By this configuration, the step difference between the first bonding segment B1 and the second bonding segment B2 around the first mark 102 and/or the second mark 202 can be reduced, the risk of cracks occurring in the first bonding segment B1 during the pressing can be reduced, the space utilization of the display module can be improved, and the difficulty of subsequent detection or maintenance of the display module bonding segment can be reduced.

Figure 13:
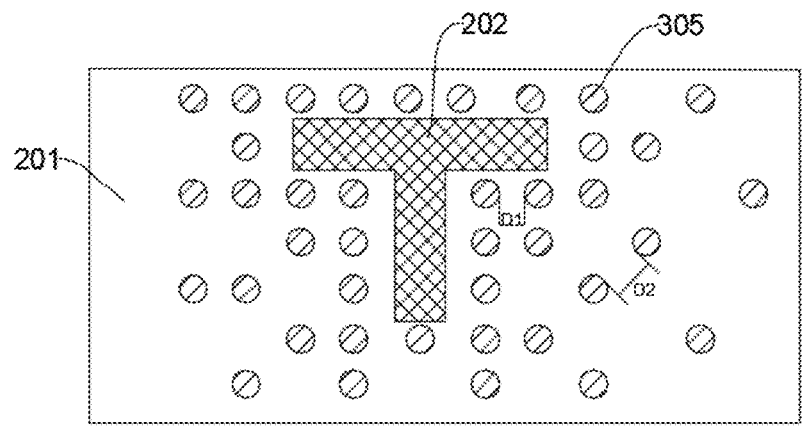
FIG. 13 is a top view showing a position of a second mark of a flexible circuit board of a display module according to an embodiment of the present disclosure.

In one embodiment, as shown in FIGS. 12 and 13, in one of the support structure groups, the spacing between two adjacent support structures 305 is gradually increased in a direction away from the first mark 102 and/or the second mark 202. That is, in FIG. 13, D2 is greater than D1.

It is to be noted that, the cause of generating cracks in the first bonding segment B1 around the first marker 102 is related to the area of the marker in addition to the step difference between the first bonding segment B1 and the second bonding segment B2. The smaller the area of the mark, the clearer the cracks on the first bonding segment B1 around the mark.

Specifically, the spacing between the support structures 305 is the shortest distance between the sides of two adjacent support structures 305.

Specifically, the support structure group corresponding to the first mark 102 is taken as an example for explanation. As the distance from the first mark 102 increases, the spacing between two adjacent support structures 305 gradually increases. This can be understood that the support structures 305 in the support structure group includes a plurality of sub-support structure groups, and the plurality of sub-support structure groups are at different distances from the first mark 102. Each of the sub-support structure groups includes a plurality of support structures 305, the spacing between two adjacent support structures 305 in each of the sub-support structure groups is the same, and the spacing between adjacent support structures 305 in different sub-support structure groups gradually increases as the sub-support structure groups are farther away from the first mark 102.

It can be understood that, the support structures 305 within one support structure group are set such that as the distance from one mark increases, the spacing between any two adjacent support structures 305 increases, and the higher the arrangement density of the support structures 305 near the mark, the closer the support layer 30 is to the mark, and the stronger the support capability. This effectively reduces the risk of generating indentation on the first bonding segment B1 around the marker, and improves the product reliability of the display module.

Figure 14:
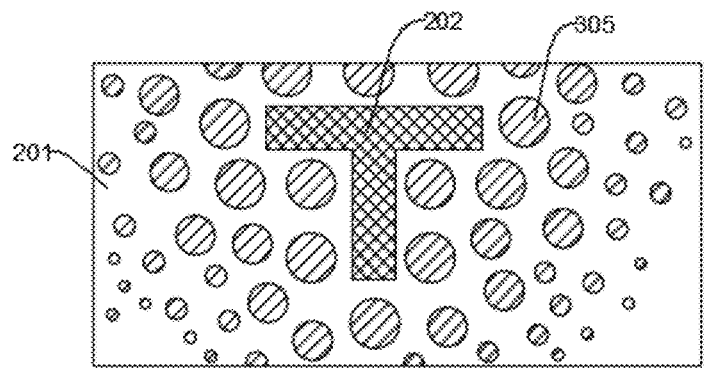
FIG. 14 is a top view showing a position of a second mark of a flexible circuit board of a display module according to an embodiment of the present disclosure.

In an embodiment, as shown in FIG. 14, within one support structure group, a projection area of the support structures 305 on the first bonding segment is gradually reduced in a direction away from the first mark 102 and/or the second mark 202.

Specifically, the materials for forming the individual support structures 305 may be the same or different.

Specifically, the support structure group corresponding to the first mark 102 is taken as an example for explanation. As the distance from the first mark 102 increases, the projection area of the support structures 305 on the first bonding segment gradually decreases. This may be understood that, the support structures 305 in the support structure group includes a plurality of sub-support structure groups, and the plurality of sub-support structure groups are at different distances from the first mark 102. Each of the sub-support structure groups includes a plurality of support structures 305. The projection area of the support structures 305 in each of the sub-support structure groups on the first bonding segment is the same, and the projection area of the support structures 305 in different sub-support structure groups on the first bonding segment gradually decreases as the sub-support structure groups are farther from the first mark 102. It can be understood that by providing the support structures 305 close to the marker to have a large area, the problem of generating indentation on the first bonding segment B1 due to the step difference between the first bonding segment B1 and the second bonding segment B2 during the pressing of the display module can be better alleviated.

In an embodiment, each of the support structures 305 includes a first surface facing the first bonding segment and a second surface facing the second bonding segment, and an area of the first surface is greater than an area of the second surface in the direction perpendicular to the first bonding segment.

It is to be noted that, the first bonding segment B1 of the display panel 10 is more prone to generating indentation than the second bonding segment B2 of the flexible circuit board 20.

Specifically, the shapes of the first surface and the second surface are not limited, and may be a circular, or a square form.

Specifically, a projection of the second surface on the first bonding segment B1 falls within the first surface.

It can be understood that, the area of the first surface of the support structure 305 in contact with the display panel 10 is settled to be larger than the area of the second surface in contact with the flexible circuit board 20, and the pressing force applied to the display panel 10 by the support layer 30 when bonding and pressing the display module is alleviated by increasing the contact area, thereby alleviating the indentation.

EXPERIMENTAL EXAMPLES

Experimental Example 1

As shown in FIG. 5, only the second bonding segment B2 is provided with the support layer 30, and the support layer 30 surrounds the second bonding terminal 203 and the second marker 202. The support layer 30 is an organic film layer provided on the entire surface.

Experimental Example 2

As shown in FIG. 3, only the second bonding segment B2 is provided with the support layer 30, and the support layer 30 surrounds the second marker 202. The support layer 30 is an organic film layer.

Experimental Example 3

As shown in FIG. 4, only the first bonding segment B1 is provided with the support layer 30, and the support layer 30 surrounds the first marker 102. The support layer 30 is an organic film layer.

A simulation model test is performed for the three experimental examples above described, and a 2D finite element model is established for the three experimental examples.

Figure 16:
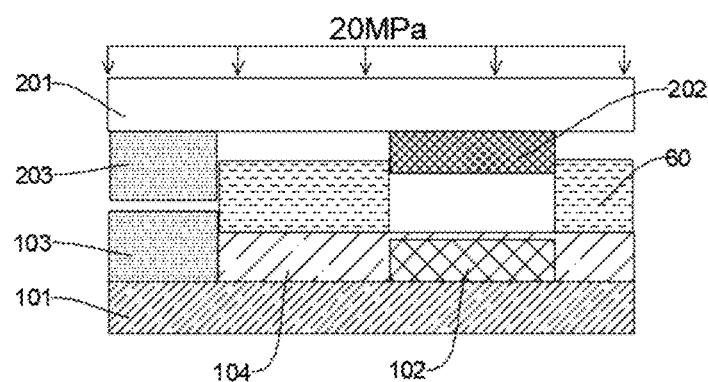
FIG. 16 is a schematic diagram of a simulation model of a display module according to an embodiment of the present disclosure.
Figure 17:
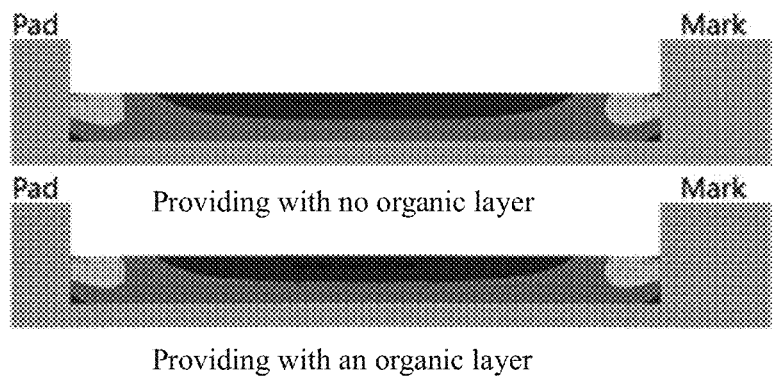
FIG. 17 is a comparison diagram of simulation model test results of a display module according to an embodiment of the present disclosure.

Since the organic film layers around the marks (specifically, between the second mark 202 and the second bonding terminal 203) in the display modules of Experimental Examples 1 and 2 are disposed in the same manner, and the material for forming the organic film layers is polyimide, a first finite element model for the position around the second mark 202 is established jointly. Specifically, as shown in FIG. 16, an adhesive 60 is disposed between the display panel 10 and the flexible circuit board 20 in FIG. 16, 20 MPa pressure is applied to the simulation element model. The maximum transverse tensile strain value between the second bonding terminal 203 and the second mark 202 is observed in the model, and the calculation results are as shown in FIG. 17, in which "pad" corresponds to the second bonding terminal 203 in the experimental examples, "mark" corresponds to the second mark 202 in the experimental examples. The maximum transverse tensile strain value is reduced from 0.0006135 in which no organic layer is provided to 0.0005973. Therefore, the technical solution of Experimental Examples 1 and 2 can alleviate the pressing force between the first bonding segment B1 of the display panel 10 and the second bonding segment B2 of the flexible circuit board 20, and the improvement is obvious.

Figure 18:
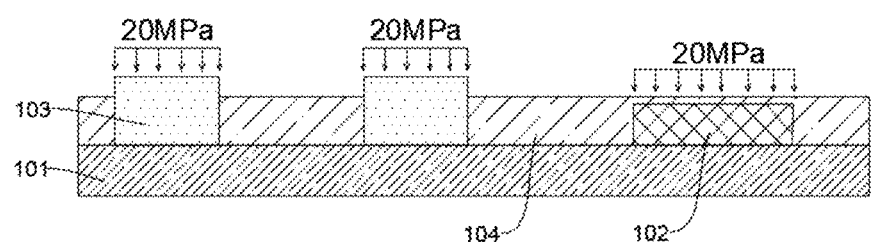
FIG. 18 is a schematic diagram of a simulation model of a display panel of a display module according to an embodiment of the present disclosure.
Figure 19:
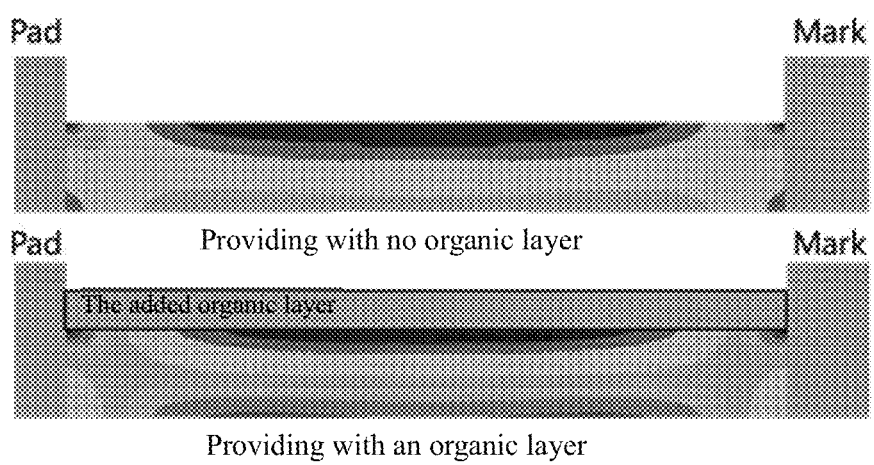
FIG. 19 is a comparison diagram of simulation model test results of a display panel of a display module according to an embodiment of the present disclosure.

A scheme in which an organic layer was added between the mark and the bonding terminal of the display panel 10 in Experimental Example 3 was verified. A second finite element model was established. As shown in FIG. 18, an organic film layer was added near the first mark 102 (the material of the organic film layer was polyimide). As a result of the calculation, as shown in FIG. 19, "pad" corresponds to the first bonding terminal 103 in the experimental example, and "mark" corresponds to the first mark 102 in the experimental example. It can be seen that the maximum transverse tensile strain of the inorganic protective layer 104 near the mark in the Experimental Example 3 is 0.0002198, which is significantly less than the 0.000253 in which the organic layer is not provided. Therefore, the technical solution of the Experimental Example 3 can alleviate the pressing force between the display panel 10 and the bonding segment of the flexible circuit board 20, and the improvement is obvious.

It is to be noted that the maximum tensile strain does not have a unit, and that a higher maximum tensile strain indicates a greater degree of deformation of the pressed surfaces, so a smaller value is preferable.

In addition, an embodiment of the present disclosure further provides a mobile terminal, which includes a display module and a terminal body according to any one of the above embodiments, wherein the terminal body and the display module are integrated with each other.

Specifically, the mobile terminal includes, but is not limited to, the following types: a rollable or foldable mobile phone, a watch, a bracelet, a television or other wearable display or touch electronic device, and a flexible smartphone, a tablet computer, a notebook computer, a desk-top display, a television, smart glasses, a smart watch, an ATM machine, a digital camera, an on-board display, a medical display, an industrial display, an e-book, an electrophoretic display device, a game machine, a transparent display, a double-sided display, a naked-eye 3D display, a mirror display device, a semi-reverse and semi-transparent display device, and the like.

In summary, the display module provided in the present disclosure includes a display panel and a flexible circuit board provided opposite to the display panel. The first bonding segment B1 of the display panel includes a first mark 102 and a first bonding terminal 103. The second bonding segment B2 of the flexible circuit board includes a second mark 202 and a second bonding terminal 203. The first bonding terminal 103 is aligned to the second bonding terminal 203. A support layer 30 is disposed between the first bonding segment B1 and the second bonding segment B2. The support layer 30 is disposed at least on the peripheral side of the first mark 102 and/or the second mark 202. By this configuration, the step difference between the first bonding segment B1 and the second bonding segment B2 around the marks is effectively reduced. The problem that the force applied to the display panel 10 is uneven due to the small area of the mark and the large step difference between the mark and the pressed surface during the bonding and pressing of the display module, in particular, the problem that cracks are easily generated in a high temperature and high pressure environment, is solved. The probability of cracks occurring at corresponding positions of the display panel 10 is reduced, and the reliability of the product is improved.

It can be understood that equivalent substitutions or alterations may be made to those of ordinary skill in the art in accordance with the technical solutions of the present disclosure and its inventive concept, and all such alterations or substitutions shall fall within the scope of the claims appended to the present disclosure.

What is claimed is:
1. A display module comprising:
a display panel comprising a display segment and a first bonding segment, the first bonding segment being provided with a first mark and a first bonding terminal; and
a flexible circuit board comprising a second bonding segment disposed opposite to the first bonding segment, the second bonding segment being provided with a second mark and a second bonding terminal, the second bonding terminal corresponding to and being electrically connected to the first bonding terminal, the second mark being disposed opposite to the first mark;
wherein a support layer is disposed between the first bonding segment and the second bonding segment, and a projection of the support layer in a direction perpendicular to the first bonding segment is disposed at least on a peripheral side of the first mark and/or the second mark, and
the support layer is disposed at least on a side of the first mark and/or the second mark close to the first bonding terminal and/or the second bonding terminal, and the support layer is in contact with only a side surface of the first bonding terminal and/or the second bonding terminal closest to the first mark and/or the second mark.

2. The display module of claim 1, wherein a thickness of the support layer in the direction perpendicular to the first bonding segment is less than a perpendicular distance between the first bonding segment and the second bonding segment, and the support layer is spaced apart from the first bonding segment or the second bonding segment.

3. The display module of claim 1, wherein the support layer comprises a first support layer disposed on the first bonding segment and/or a second support layer disposed on the second bonding segment.

4. The display module of claim 3, wherein the support layer comprises the first support layer and the second support layer, and a height of the second support layer in a direction perpendicular to the second bonding segment is less than a height of the second bonding terminal.

5. The display module of claim 3, wherein the support layer comprises a third support layer disposed on the first bonding segment, and a projection of the third support layer in the direction perpendicular to the first bonding segment is disposed on a peripheral side of the first bonding terminal.

6. The display module of claim 3, wherein the support layer comprises a fourth support layer disposed on the second bonding segment, and a projection of the fourth support layer in the direction perpendicular to the first bonding segment is disposed on a peripheral side of the second bonding terminal.

7. The display module of claim 1, wherein the support layer comprises an organic film layer disposed on the first bonding segment, and the organic film layer is disposed surround the first mark in the direction perpendicular to the first bonding segment, and/or
the organic film layer is disposed on the second bonding segment, and the organic film layer is disposed surround the second mark in a direction perpendicular to the second bonding segment.

8. The display module of claim 1, wherein the support layer comprises at least one support structure group, the number of the at least one support structure group is the same as the number of the first mark; one of the at least one support structure group comprises a plurality of spaced support structures, and the plurality of support structures are disposed on a peripheral side of a corresponding first mark and/or second mark.

9. The display module of claim 8, wherein a spacing between every two adjacent support structures is gradually increased along a direction away from the first mark and/or the second mark, within one of the at least one support structure group.

10. The display module of claim 8, wherein a projection area of the support structures on the first bonding segment is gradually reduced in a direction away from the first mark and/or the second mark, within one of the at least one support structure group.

11. The display module of claim 8, wherein each of the support structures comprises a first surface facing the first bonding segment and a second surface facing the second bonding segment, and an area of the first surface is greater than an area of the second surface in the direction perpendicular to the first bonding segment.

12. A mobile terminal, comprising a display module and a terminal body, wherein the terminal body is integrated with the display module, and the display module comprises:

a display panel comprising a display segment and a first bonding segment, the first bonding segment being provided with a first mark and a first bonding terminal; and a flexible circuit board comprising a second bonding segment disposed opposite to the first bonding segment, the second bonding segment being provided with a second mark and a second bonding terminal, the second bonding terminal corresponding to and being electrically connected to the first bonding terminal, the second mark being disposed opposite to the first mark;

wherein a support layer is disposed between the first bonding segment and the second bonding segment, and a projection of the support layer in a direction perpendicular to the first bonding segment is disposed at least on a peripheral side of the first mark and/or the second mark, and the support layer is disposed at least on a side of the first mark and/or the second mark close to the first bonding terminal and/or the second bonding terminal, and the support layer is in contact with only a side surface of the first bonding terminal and/or the second bonding terminal closest to the first mark and/or the second mark.

13. The mobile terminal of claim 12, wherein a thickness of the support layer in the direction perpendicular to the first bonding segment is less than a perpendicular distance between the first bonding segment and the second bonding segment, and the support layer is spaced apart from the first bonding segment or the second bonding segment.

14. The mobile terminal of claim 12, wherein the support layer comprises a first support layer disposed on the first bonding segment and/or a second support layer disposed on the second bonding segment.

15. The mobile terminal of claim 14, wherein the support layer comprises the first support layer and the second support layer, and a height of the second support layer is less than a height of the second bonding terminal in a direction perpendicular to the second bonding segment.

16. The mobile terminal of claim 14, wherein the support layer comprises a third support layer disposed on the first bonding segment, and a projection of the third support layer in the direction perpendicular to the first bonding segment is disposed on a peripheral side of the first bonding terminal.

17. The mobile terminal of claim 14, wherein the support layer comprises a fourth support layer disposed on the second bonding segment, and a projection of the fourth support layer in the direction perpendicular to the first bonding segment is disposed on a peripheral side of the second bonding terminal.

18. The mobile terminal of claim 12, wherein the support layer comprises an organic film layer disposed on the first bonding segment, and the organic film layer is disposed surround the first mark in the direction perpendicular to the first bonding segment, and/or
the organic film layer is disposed on the second bonding segment, and the organic film layer is disposed surround the second mark in a direction perpendicular to the second bonding segment.

19. The mobile terminal of claim 12, wherein the support layer comprises at least one support structure group, the number of the at least one support structure group is the same as the number of the first mark; one of the at least one support structure group comprises a plurality of spaced support structures, and the plurality of support structures are disposed on a peripheral side of a corresponding first mark and/or second mark.

20. The mobile terminal of claim 19, wherein a spacing between every two adjacent support structures is gradually increased along a direction away from the first mark and/or the second mark, within one of the at least one support structure group.

\* \* \* \* \*